United States Patent
Komukai

(10) Patent No.: US 10,459,335 B2
(45) Date of Patent: Oct. 29, 2019

(54) TEMPLATE AND TEMPLATE MANUFACTURING METHOD

(71) Applicant: Toshiba Memory Corporation, Tokyo (JP)

(72) Inventor: Toshiaki Komukai, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 19 days.

(21) Appl. No.: 15/698,025

(22) Filed: Sep. 7, 2017

(65) Prior Publication Data

US 2018/0267400 A1    Sep. 20, 2018

(30) Foreign Application Priority Data

Mar. 14, 2017    (JP) .................................. 2017-048124

(51) Int. Cl.
| | |
|---|---|
| B29C 59/00 | (2006.01) |
| B29C 59/16 | (2006.01) |
| G03F 1/42 | (2012.01) |
| H01L 21/027 | (2006.01) |
| G03F 1/56 | (2012.01) |
| G03F 1/80 | (2012.01) |
| G03F 7/00 | (2006.01) |
| G03F 9/00 | (2006.01) |

(52) U.S. Cl.
CPC .................. *G03F 1/42* (2013.01); *G03F 1/56* (2013.01); *G03F 1/80* (2013.01); *G03F 7/0002* (2013.01); *G03F 9/7042* (2013.01); *H01L 21/0272* (2013.01)

(58) Field of Classification Search
CPC ......... B29C 59/00; B29C 59/16; B29C 43/02; B32B 3/10
USPC ........................................................ 425/385
See application file for complete search history.

(56) References Cited

U.S. PATENT DOCUMENTS

| | | | |
|---|---|---|---|
| 7,331,283 B2 | 2/2008 | Sewelll | |
| 8,027,089 B2 | 9/2011 | Hayashi | |
| 2010/0092599 A1* | 4/2010 | Selinidis | B82Y 10/00 425/470 |
| 2012/0244319 A1* | 9/2012 | Wuister | B82Y 10/00 425/470 |
| 2014/0061969 A1* | 3/2014 | Okamoto | B29C 59/002 425/385 |
| 2016/0009020 A1 | 1/2016 | Takakuwa et al. | |

FOREIGN PATENT DOCUMENTS

| | | |
|---|---|---|
| JP | 4679585 | 4/2011 |
| JP | 5024047 | 9/2012 |
| JP | 2013-168604 | 8/2013 |
| JP | 2016-21544 | 2/2016 |

* cited by examiner

*Primary Examiner* — Joseph S Del Sole
*Assistant Examiner* — Thu Khanh T Nguyen
(74) *Attorney, Agent, or Firm* — Finnegan, Henderson, Farabow, Garrett & Dunner, L.L.P.

(57) ABSTRACT

According to an embodiment, a template is provided which includes a template substrate, and a device formation pattern and an alignment mark provided on a common surface of the template substrate. The alignment mark includes a refraction layer provided at a bottom of a first concave pattern provided on the template substrate, and an insulating layer filling the first concave pattern provided with the refraction layer.

7 Claims, 27 Drawing Sheets

TEMPLATE AND TEMPLATE MANUFACTURING METHOD

CROSS-REFERENCE TO RELATED APPLICATIONS

This application is based upon and claims the benefit of priority from Japanese Patent Application No. 2017-43124, filed on Mar. 14, 2017; the entire contents of which are incorporated herein by reference.

FIELD

Embodiments described herein relate generally to a template and. a template manufacturing method.

BACKGROUND

An imprint method is a pattern forming method that brings a template into direct contact with a resist dropped on a substrate. The template is provided with an alignment mark for performing positioning with respect to the substrate. In order to enable the positioning even when the alignment mark is filled with a resist similar in refractive index to the template, a Cr film, different in refractive index from the template is provided at the bottom of each of concave (recessed) patterns that compose the alignment mark.

In this structure, there are countermeasures provided to prevent damage of the alignment mark caused by static electrification and/or electric discharge, breakage of the template caused by particles, and deterioration in positioning accuracy caused by cleaning.

DETAILED DESCRIPTION

In general, according to one embodiment; a template is provided which includes a template substrate, and a device formation pattern and an alignment mark provided on a common surface of the template substrate. The alignment mark includes a refraction layer provided at a bottom of a first concave pattern provided on the template substrate, and an insulating layer filling the first concave pattern, provided with the refraction layer.

Exemplary embodiments of a template and a template manufacturing method will be explained below in detail with reference to the accompanying drawings. The present invention is act limited to the following embodiments. The sectional views of a template used in the following embodiments are schematic, and so the relationship between the thickness and width of each, layer and/or the thickness ratios between respective layers may be different from actual states.

(First Embodiment)

Figure 1:
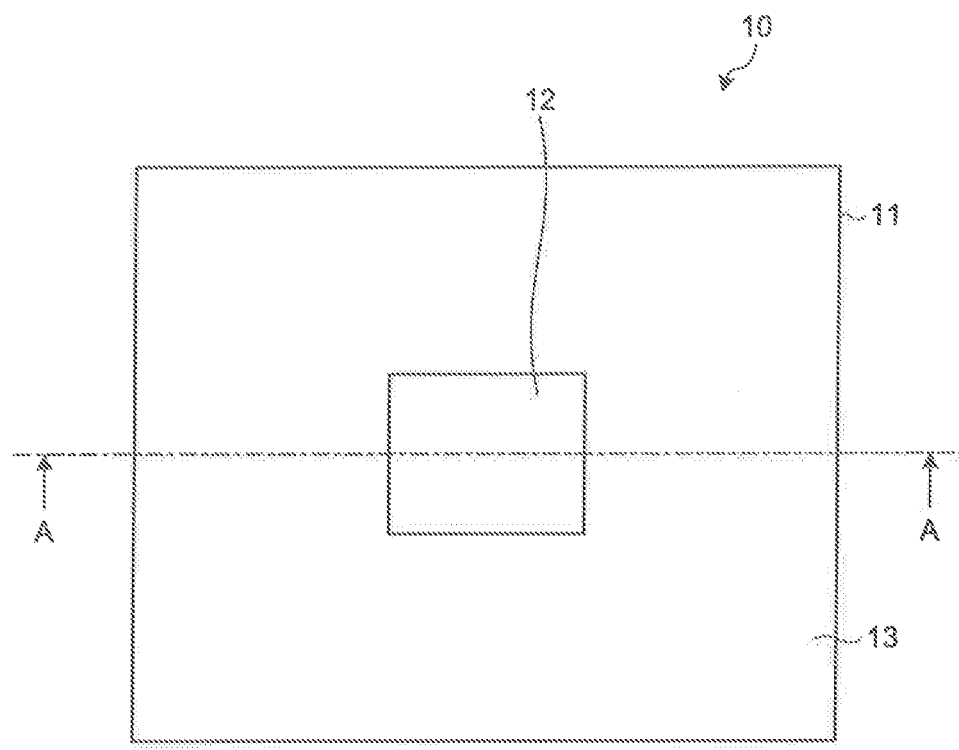
FIG. 1 is a top view illustrating a structural example of a template.
Figure 2:
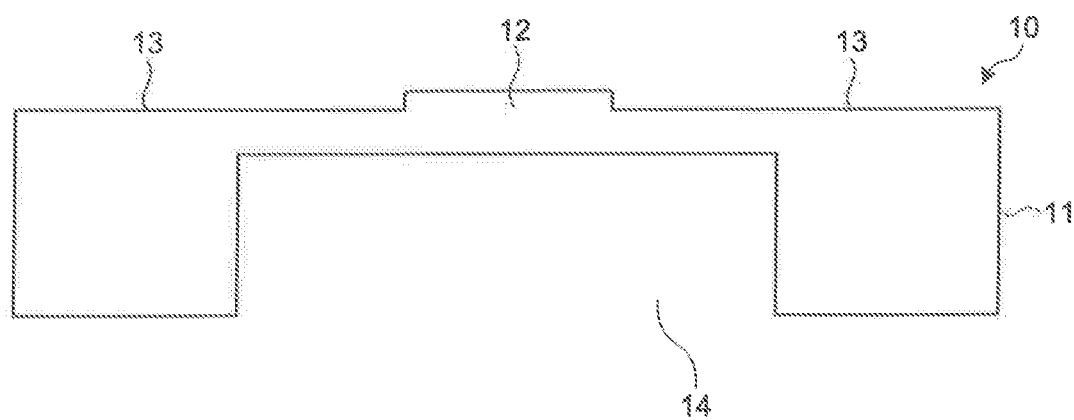
FIG. 2 is a sectional view illustrating the structural example of the template.
Figure 3:
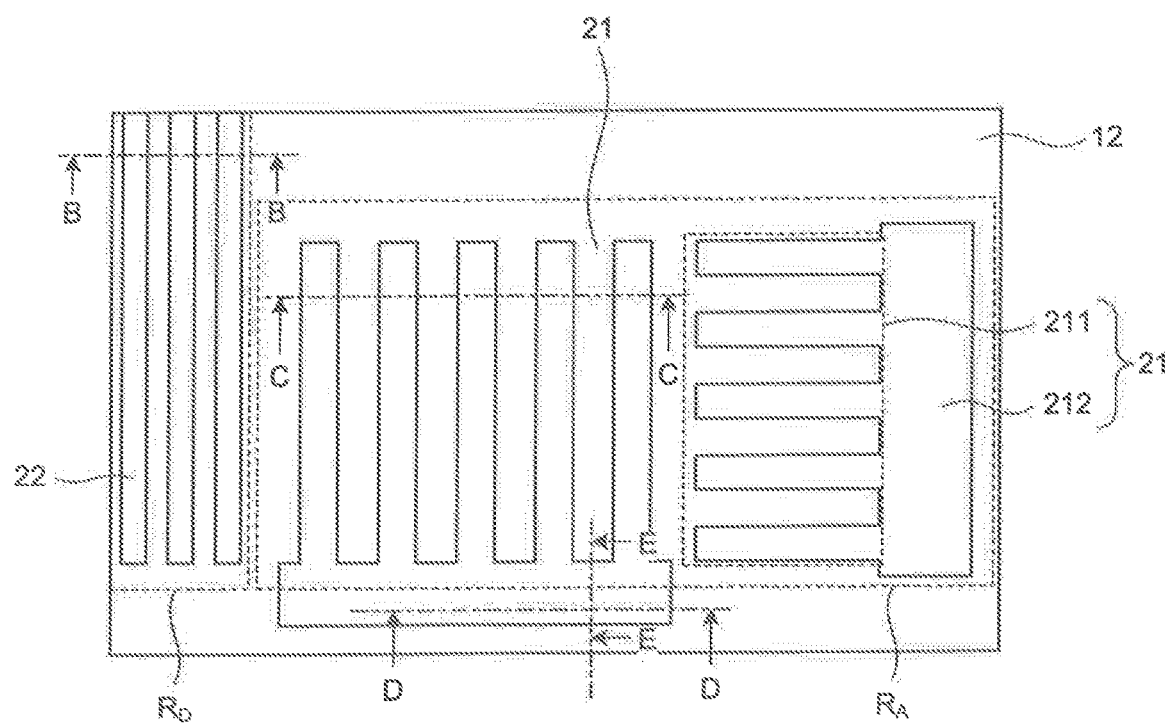
FIG. 3 is a partial top view illustrating an example of a region including alignment marks in a template according to a first embodiment.
Figure 4A:
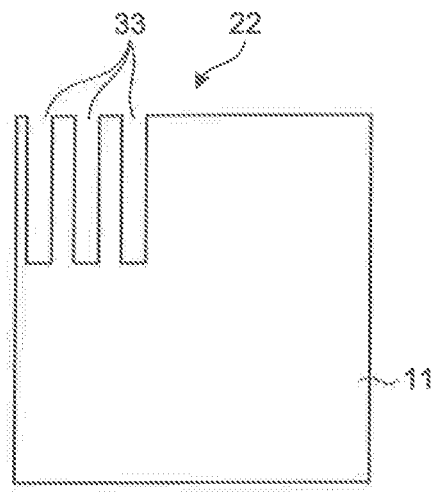
FIGS. 4A to 4D are sectional views illustrating an example of a device pattern and an alignment mark in the template according to the first embodiment.
Figure 4B:
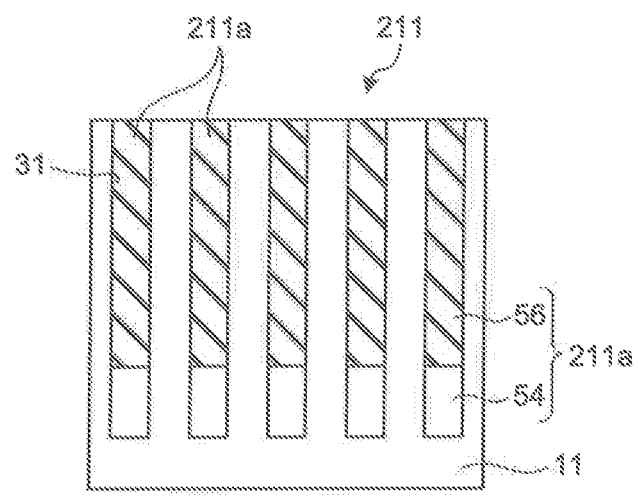
Figure 4C:
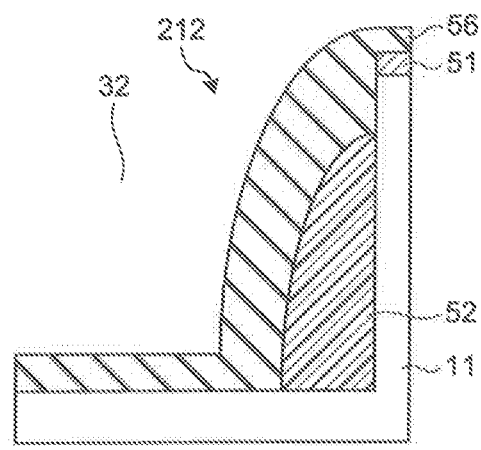
Figure 4D:
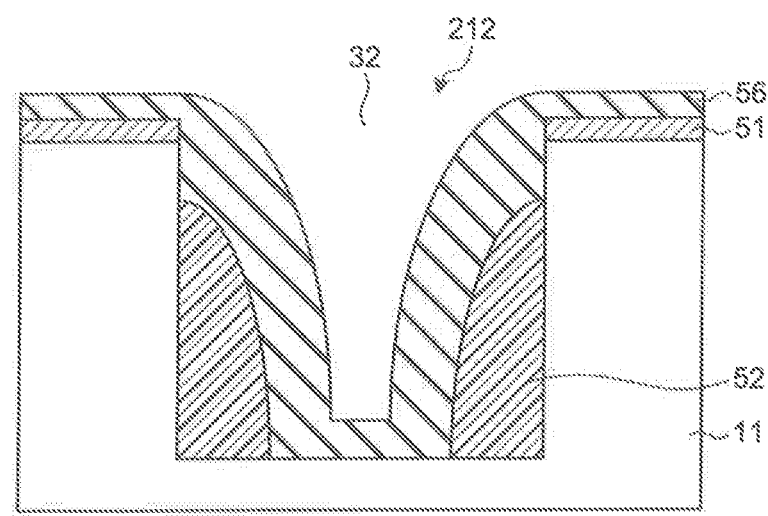

FIG. 1 is a top view illustrating a structural example of a template. FIG. 2 is a sectional view illustrating the structural example of the template, which is a sectional view taken along a line A-A of FIG. 1. FIG. 3 is a partial top view illustrating an example of a region including alignment marks in a template according to a first embodiment, FIGS. 4A to 4D are sectional views illustrating an example of a device pattern and an alignment mark in the template according to the first embodiment. FIG. 4A is a sectional view taken along a line B-B of FIG. 3, FIG. 4B is a sectional view taken along a line C-C of FIG. 3. FIG. 4C is a sectional view taken along a line D-D of FIG. 3. FIG. 4D is a sectional view taken along a line E-E of FIG. 3.

The template 10 has been prepared by processing a rectangular template substrate 11. The template substrate 11 includes a mesa part 12 and an off-mesa part 13 on the upper surface side, such that the mesa part 12 is at and near the center and is provided with a concave-convex (rugged) pattern, and the off-mesa part 13 is arranged at a region other than the mesa part 12. The mesa part 12 has a mesa structure projected with respect to the off-mesa part 13. The mesa part 12 is configured to come in contact with a resist on a substrate (not shown) during an imprint process. Further, template substrate 11 includes a recessed part (bore) 14 formed in the lower surface. The recessed part 14 is arranged to include a region corresponding to the mesa part 12 that is on the upper surface side. The template substrate 11 is preferably made of a material that transmits ultraviolet rays. For example, the template substrate 11 is made of quartz.

The mesa part 12 includes a device formation pattern arrangement region $R_D$, in which a device formation pattern 22 for forming a device pattern on the substrate is arranged, and alignment mark arrangement regions $R_A$, in which alignment marks 21 for performing positioning with respect to the substrate are arranged. For example, the device formation pattern 22 includes line and space patterns or the like, in which concave patterns 33 that extend are arranged at predetermined intervals in a direction intersecting with the extending direction.

The alignment mark arrangement regions $R_A$ are arranged, for example, near the corners (four corners) of the mesa part 12. Each of the alignment marks 21 includes a diffraction grating pattern 211 to be used for performing positioning with respect to the substrate, and an additional pattern 212 disposed in contact with the diffraction grating pattern 211. For example, the diffraction grating pattern 211 is composed of so-called line and space patterns, in which a plurality of extending patterns 211a are arranged in parallel with each other and at predetermined intervals in a direction intersecting with the extending direction. Further, in the example of FIG. 3, two alignment marks 21 are arranged in each of the alignment mark arrangement region $R_A$, such that the extending directions of their diffraction grating patterns 211 are orthogonal with each other.

The diffraction grating pattern 211 has a structure such that an insulating layer 56 is provided on the upper side in each of concave patterns 31 formed and extending in the template substrate 11. The insulating layer 56 does not entirely fill the inside of each of the concave patterns 31, and a refraction layer 54 is provided below the insulating layer 56 in each concave pattern 31. Specifically, the lower side of each concave pattern 31 is set as a hollow that is lidded with the insulating layer 56 on the upper side. The insulating layer 56 is made of silicon oxide or the like, and is preferably made of the same material as the template substrate 11. The refraction layer 54 may be made of gas, such as air, oxygen, or nitrogen, which has a refractive index different from the refractive index of the template substrate 11, or may be made of a vacuum.

The additional pattern 212 has a structure such that a concave pattern 32 is disposed to connect to each other the extending direction end portions of the plurality of concave patterns 31 that compose the diffraction grating pattern 211, and the connecting region of the concave pattern 32 to the concave patterns 31 is covered with the insulating layer 56. Specifically, while the refraction layer 54 is formed at the bottom of each concave pattern 31 of the diffraction grating pattern 211, the boundary portion between the concave pattern 32 and the refraction layer 54 is covered with the insulating layer 56, by which the refraction layer 54 is blocked from the outside. Here, the sidewall of the concave pattern 32 not connected to the concave patterns 31 is provided with an organic film 52 containing carbon, such as an SOC film, and the insulating layer 56 is disposed to cover the organic film 52. Further, the bottom of the concave pattern 32 is also covered with the insulating layer 56.

As described above, in the first embodiment, positioning is performed by using the refraction layer 54 at the bottom of the patterns 211a of each alignment mark 21 as a diffraction grating. Hereinafter, an explanation will be given of the thicknesses of the refraction layer 54 and insulating layer 56, which can provide primary diffracted light intensity equivalent to that obtained by using a Cr film as the diffraction grating, on the basis of results of performing simulations.

Figure 5A:
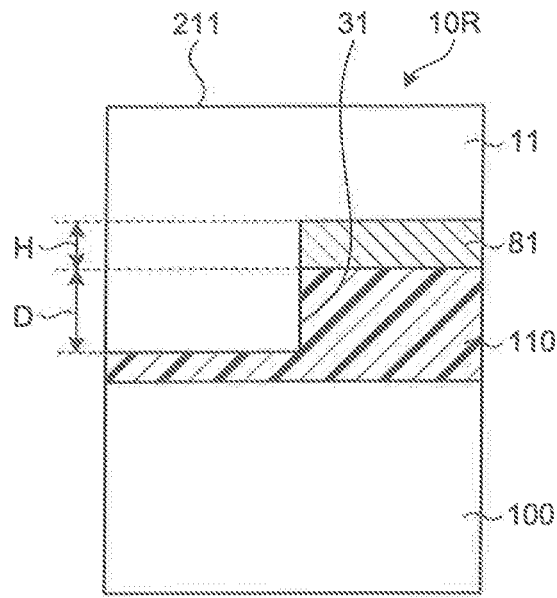
FIGS. 5A and 5B are diagrams illustrating models used for simulations.
Figure 5B:
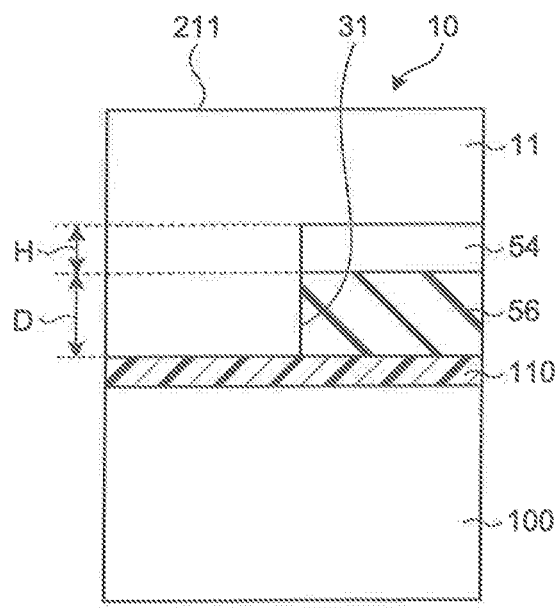

FIGS. 5A and 5B are diagrams illustrating models used for the simulations. FIG. 5A illustrates a model of a comparative example in which the diffraction grating is composed of a Cr film. FIG. 5B illustrates a model of the first embodiment in which the diffraction grating is composed of the refraction layer covered with the insulating layer. As illustrated in FIG. 5A, in a template 10R according to the comparative example, a Cr film 81 having a thickness of H nm is provided at the bottom of each concave pattern 31 of the diffraction grating pattern 211 in the alignment mark. Here, unlike the first embodiment, there is no lid provided below the Cr film 81. The primary diffracted light intensity was calculated by a simulation where this template 10R was set in contact with a resist 110 dropped on a substrate 100 and the diffraction grating pattern 211 was irradiated with light having a wavelength of 550 to 750 nm. Here, the calculation was performed under conditions where the thickness of the template substrate 11 was set to 1,100 nm and the thickness H of the Cr film 81 was set to 8 nm and 15 nm, which fell within a thickness range normally used. Further, in the case of the comparative example, as the resist 110 would come to fill the inside of the concave patterns 31, the calculation was performed under conditions where the distance between the lower surface of the template substrate 11 and the lower surface of the Cr film 81 illustrated in FIG. 5A was set to D nm.

Figure 6:
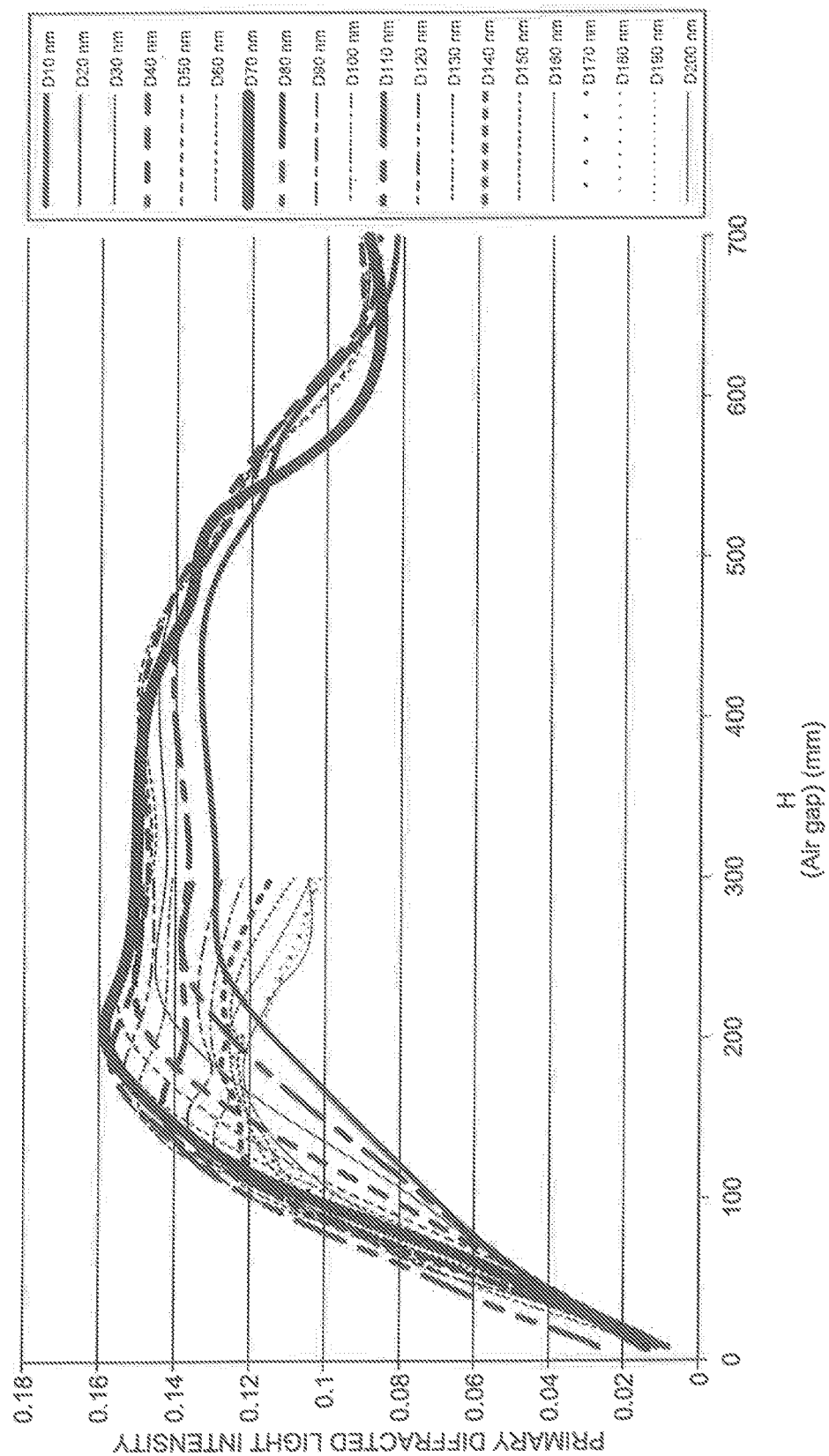
FIG. 6 is a diagram illustrating calculation results of primary diffracted light intensity obtained when positioning was performed by using the template according to the first embodiment.
Figure 7:
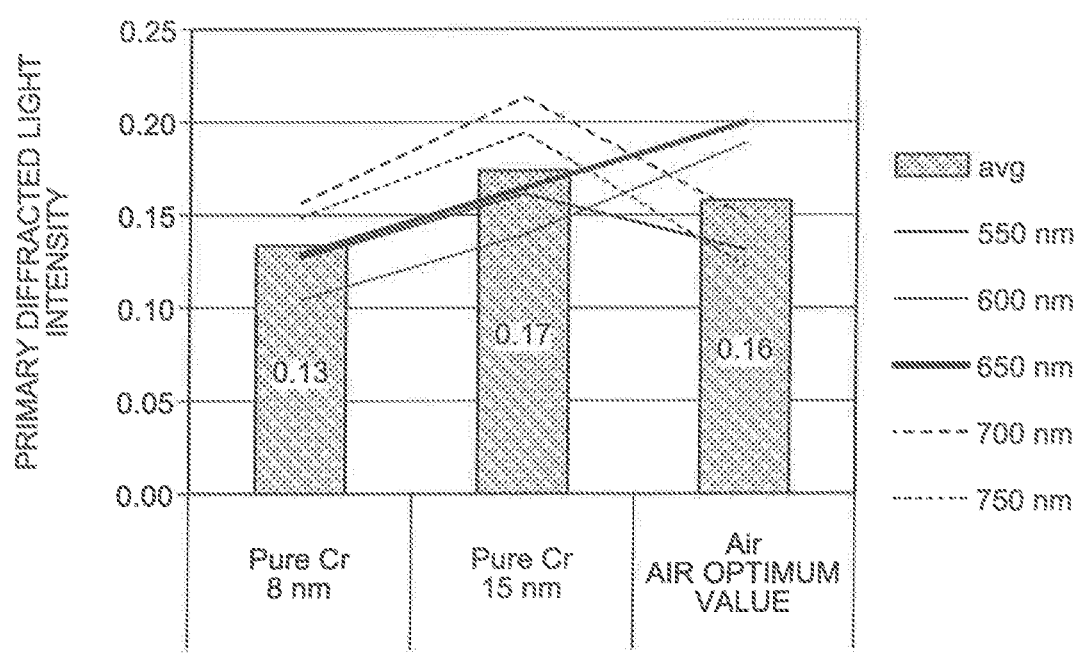
FIG. 7 is a diagram illustrating a simulation result of the primary diffracted light intensity obtained when a refraction layer and an insulating layer were optimized in the first embodiment, and simulation results of the primary diffracted light intensity in a comparative example.
Figure 8A:
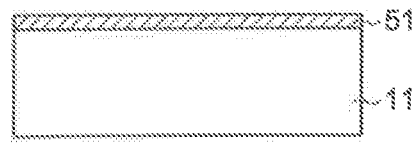
FIGS. 8A to 20D are sectional views schematically illustrating an example of the sequence of a template manufacturing method according to the first embodiment.
Figure 8B:
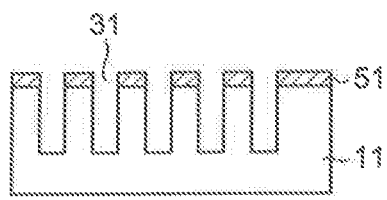
Figure 8C:
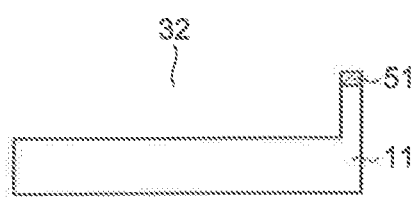
Figure 8D:
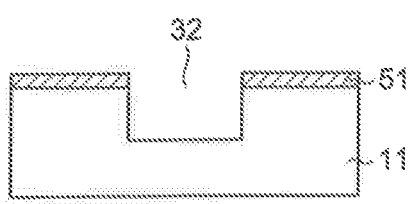
Figure 9A:
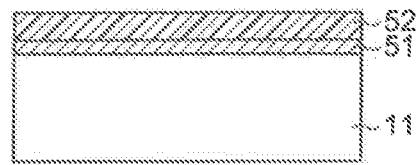
Figure 9B:
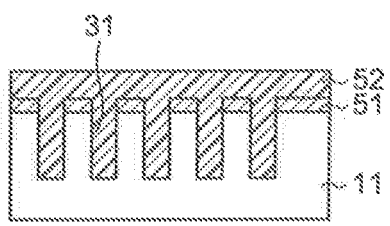
Figure 9C:
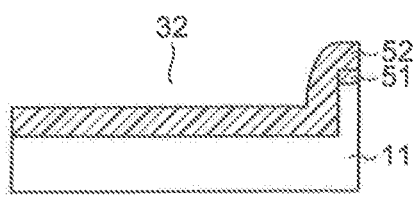
Figure 9D:
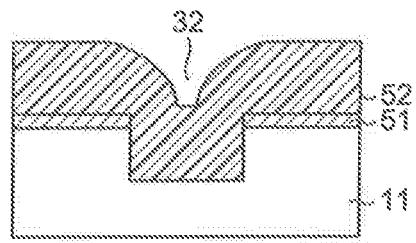
Figure 10A:
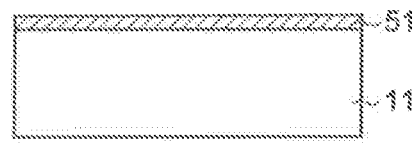
Figure 10B:
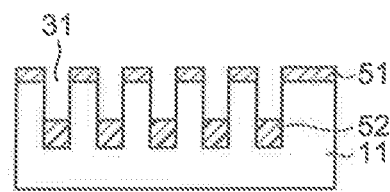
Figure 10C:
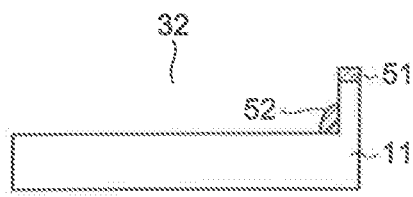
Figure 10D:
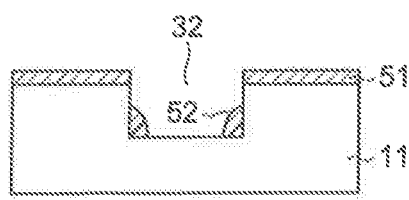
Figure 11A:
Figure 11B:
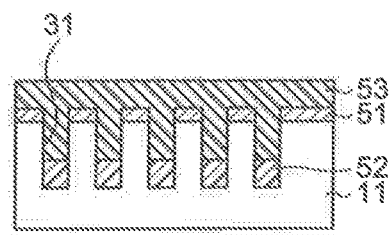
Figure 11C:
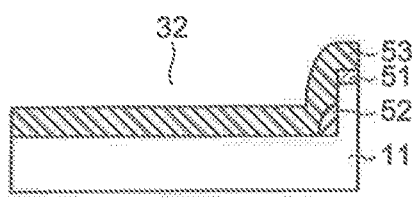
Figure 11D:
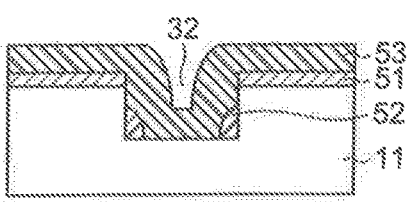
Figure 12A:
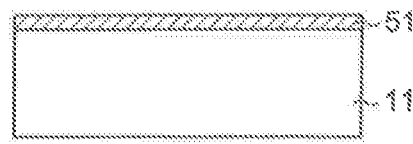
Figure 12B:
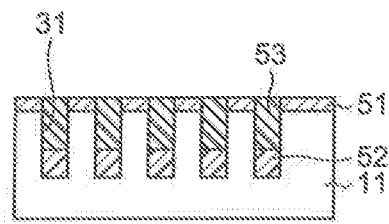
Figure 12C:
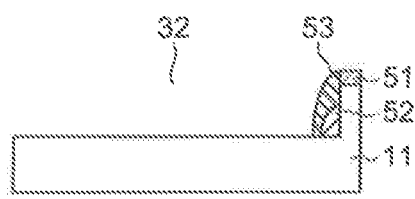
Figure 12D:
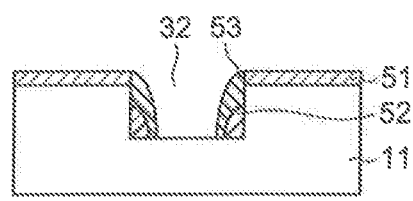
Figure 13A:
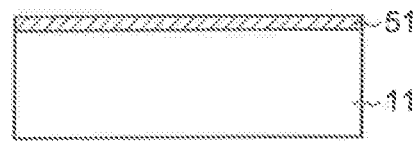
Figure 13B:
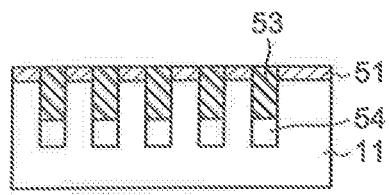
Figure 13C:
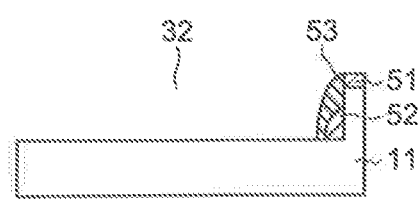
Figure 13D:
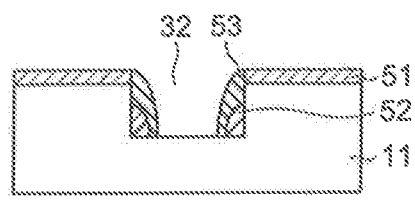
Figure 14A:
Figure 14B:
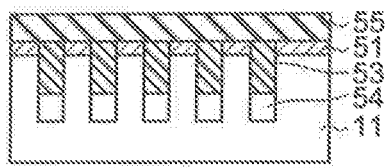
Figure 14C:
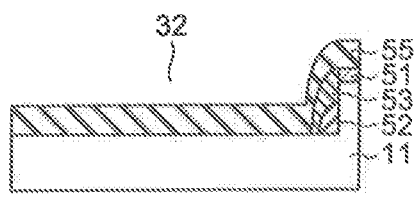
Figure 14D:
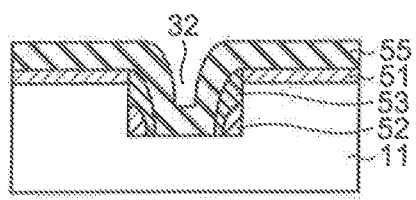
Figure 15A:
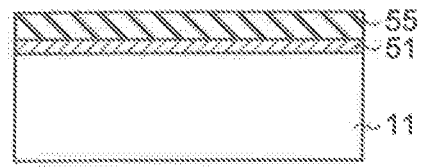
Figure 15B:
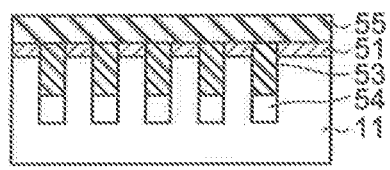
Figure 15C:
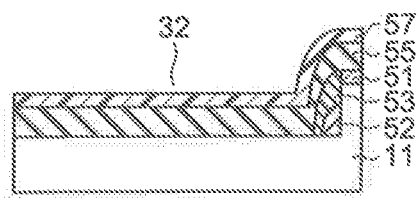
Figure 15D:
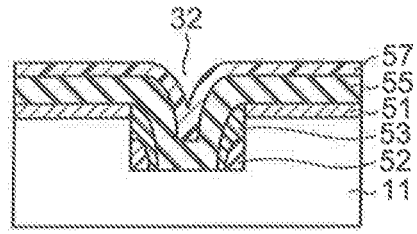
Figure 16A:
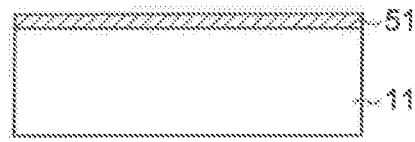
Figure 16B:
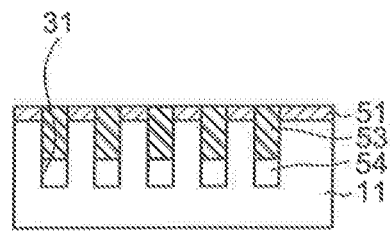
Figure 16C:
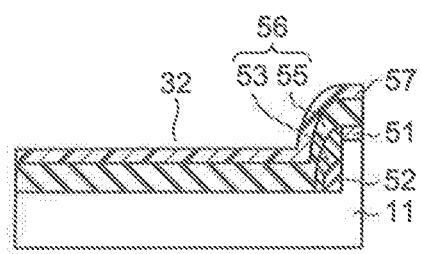
Figure 16D:
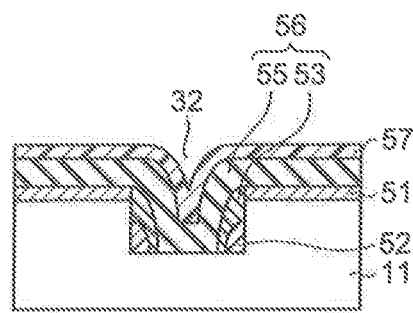
Figure 17A:
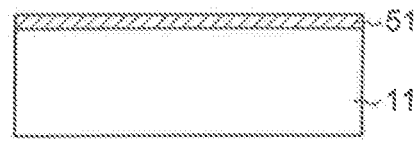
Figure 17B:
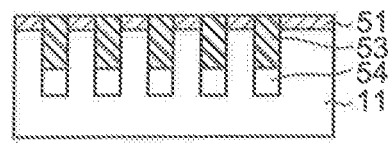
Figure 17C:
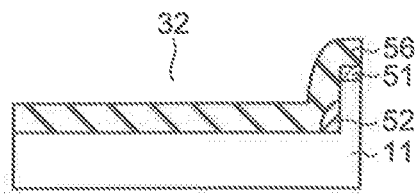
Figure 17D:
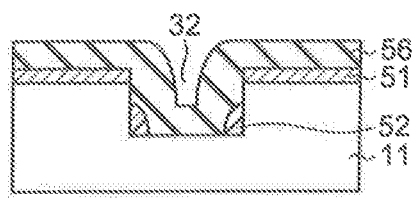
Figure 18A:
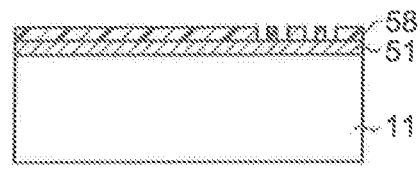
Figure 18B:
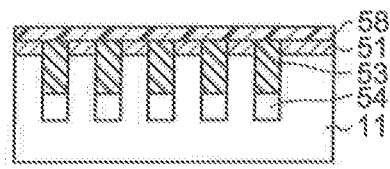
Figure 18C:
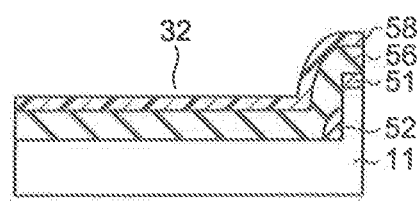
Figure 18D:
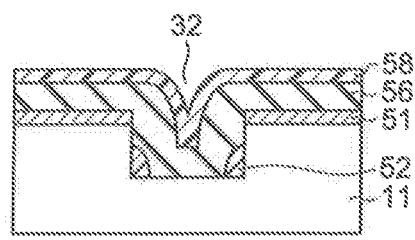
Figure 19A:
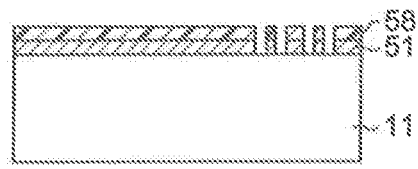
Figure 19B:
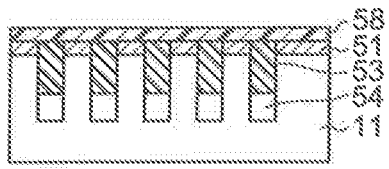
Figure 19C:
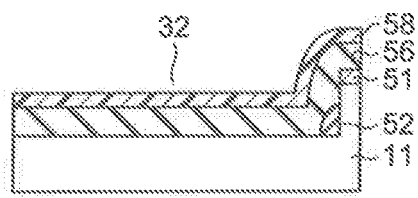
Figure 19D:
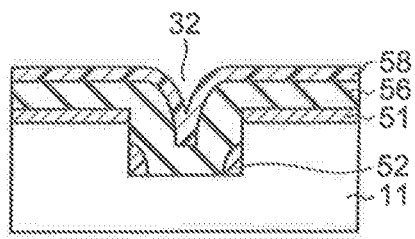
Figure 20A:
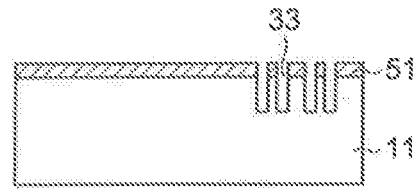
Figure 20B:
Figure 20C:
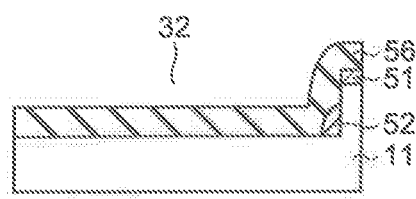
Figure 20D:
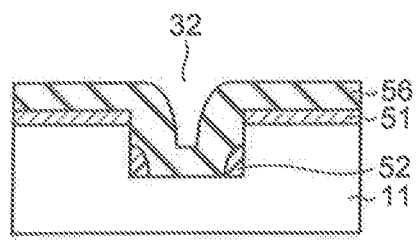

On the other hand, as illustrated in FIG. 5B, in a template 10 according to the first embodiment, the calculation was performed, as in the comparative example, under conditions where the thickness of the template substrate 11 was set to 1,100 nm, the thickness of the refraction layer 54 of the diffraction grating pattern 211 in the alignment mark was set to H nm, and the thickness of the insulating layer 56 was set to D nm. The primary diffracted light intensity was calculated by a simulation, while the thickness D of the insulating layer 56 was changed within a range of 10 nm to 200 nm, and the thickness H of the refraction layer 54 was changed within a range of 10 nm so 700 nm at each value of the thickness D. Here, in the first embodiment, the resist 110 would not come into the concave patterns 31 of the alignment mark, FIG. 6 is a diagram illustrating calculation results of the primary diffracted light intensity obtained when positioning was performed by using the template according to the first embodiment. Further, FIG. 7 is a diagram illustrating a simulation result of the primary diffracted light intensity obtained when the refraction layer and the insulating layer were optimized in the first embodiment, and simulation results of the primary diffracted light intensity in the comparative example. FIG. 7 illustrates values of the primary diffracted light intensity at respective wavelengths of 550 nm, 600 nm, 650 nm, 700 nm, and 750 nm, and the average of the values, which were obtained by each of a case of the first embodiment where the thicknesses of the refraction layer 54 and the insulating layer 56 were optimized and a case of the comparative example.

As illustrated in FIG. 7, when the Cr film 81 having a thickness of 8 nm was used, the average of values of the primary diffracted light intensity at respective wavelengths of 550 to 750 nm was 0.13. When the Cr film 81 having a thickness of 15 nm was used, the average of values of the primary diffracted light intensity at respective wavelengths of 550 to 750 nm was 0.17. Further, when the Cr film 81 having a thickness of 8 nm was used, the primary diffracted light intensity at a wavelength of 600 nm was 0.10. Accordingly, it is thought that, in the structure according to the first, embodiment, a combination of the thickness H of the refraction layer 54 and the thickness D of the insulating layer 56, by which the primary diffracted light intensity becomes 0.1 or more, can provide an effect equivalent to that of the comparative example.

With reference to FIG. 6, the primary diffracted light intensity becomes 0.1 or more, when the thickness D of the insulating layer 56 and the thickness H of the refraction layer 54 have a relationship therebetween that satisfies any one of the following (1) to (5).

$$10\text{ nm} \le D < 20\text{ nm with } 160\text{ nm} \le H \le 620\text{ nm} \quad (1)$$

$$20\text{ nm} \le D < 30\text{ nm with } 150\text{ nm} \le H \le 620\text{ nm} \quad (2)$$

$$30\text{ nm} \le D < 40\text{ nm with } 140\text{ nm} \le H \le 620\text{ nm} \quad (3)$$

$$40\text{ nm} \le D < 50\text{ nm with } 120\text{ nm} \le H \le 620\text{ nm} \quad (4)$$

$$50\text{ nm} \le D \le 200\text{ nm with } 100\text{ nm} \le H \le 600\text{ nm} \quad (5)$$

When, the relationship between the thickness H of the refraction layer 54 and the thickness D of the insulating layer 56 corresponds to any one of (1) to (5), positioning can be performed by using the alignment, marks 21 according to the first embodiment. Here, data is not included where the thickness D of the insulating layer 56 was 80 nm or more and the thickness H of the refraction layer 54 was 300 nm or more. However, such conditions indicated a tendency similar to that obtained where the thickness D of the insulating layer 56 was set to 10 nm to 70 nm at respective values of thickness D of the insulating layer 56.

Next, an explanation will be given of a manufacturing method of the template 10 according to the first embodiment. FIGS. 8A to 20D are sectional views schematically illustrating an example of the sequence of a template manufacturing method according to the first embodiment. FIGS. 8A to 20A (the drawing numbers including A) correspond, to a sectional view of the device formation pattern arrangement region. FIGS. 8B to 20B (the drawing numbers including B) correspond to a sectional view taken along the line C-C of FIG. 3. FIGS. 8C to 20C (the drawing numbers including C) correspond to a sectional view taken, along the line D-D of FIG. 3. FIGS. 8D to 20D (the drawing numbers including D) correspond to a sectional view taken along the line E-E of FIG. 3.

First, as illustrated in FIGS. 8A to 8D, a template substrate 11 is prepared; and a hard mask film 51 is formed on the upper surface of the template substrate 11. As the template substrate 11, for example, a synthetic quartz substrate or the like may be used. Furthers as the hard mask film 51, for example, a film of metal, such as Cr, Ta, Ti, or Ru; a film of metal nitride, such as TiN or TaN; a film of metal oxide, such as TaO; or an SiN film may be used.

Then, a resist (not shown) is applied onto the hard mask film 51, and patterning is performed to the resist by using an EB (Electron Beam) drawing technique and a development technique. Here, a device pattern is not formed in the device formation pattern arrangement region $R_D$, and patterns for forming alignment marks are formed only in the alignment mark arrangement regions $R_A$. Specifically, patterns for forming each diffraction grating pattern 211 and each additional pattern 212 are formed.

Thereafter, the hard mask film 51 is processed through the patterned resist serving as a mask, by using anisotropic etching, such as an RIE (Reactive Ion Etching) method. Further, the template substrate 11 is processed through the patterned, hard mask film 51 serving as a mask, by using anisotropic etching, such as an RIE method. Consequently, each set of concave patterns 31 extending to compose the diffraction grating pattern 211 and each concave pattern 32 no compose the additional pattern 212 are formed in each alignment mark arrangement region $R_A$. Each concave pattern 32 is formed to connect to each other the end portions of the corresponding set of concave patterns 31 arrayed in a predetermined direction. Further, the thickness of the hard mask film 51 and the etching time are controlled such that the depth of the concave patterns 31 is the sum of a desired thickness H of a refraction layer 54 and a thickness D of an insulating layer 56. Thereafter, the resist is peeled by using a resist peeling technique (asher).

Then, as illustrated in FIGS. 9A to 9D, an organic film 52 is applied onto the template substrate 11 with the concave patterns 31 and 32 formed thereon. As the organic film 52, an SOC (Spin on Carbon) film or the like may be used. When the organic film 52 is applied, the film thickness of the organic film 52 on a dense pattern becomes larger than the film thickness of the organic film 52 on a sparse pattern. The first embodiment utilizes this characteristic of application of the organic film 52, to generate a film thickness difference of the organic film 52 between the regions where the concave patterns 31 are arranged and the other regions. Specifically, the film thickness of the organic film 52 on the arrangement regions for the concave patterns 31 becomes larger than the film thickness of the organic film 52 on the other regions. Here, the organic film 52 is formed also inside the concave patterns 31 and 32.

Thereafter, as illustrated in FIGS. 10A to 10D, the organic film 52 is etched back by using anisotropic etching, such as an RIE method, until the surface of the hard mask film 51 is exposed in the device formation pattern arrangement region $R_D$. As described above, the organic film 52 is thicker in the arrangement regions for the concave patterns 31, and is thinner in the other regions. Thus, at the time point when the portions of the organic film 52 in the other regions have been removed, the portions of the organic film 52 embedded in the concave patterns 31 still remain without being etched away. Further, the portions of the organic film 52 on the sidewalls of each concave pattern 32 also remain. Here, each of the portions of the organic film 52 remaining inside the concave pattern 31 will be removed later to form the refraction layer 54. Accordingly, in order to provide the refraction layer 54 with the desired thickness H, the thickness of the organic film 52 and the etching time are controlled such that a portion of the organic film 52 having a thickness corresponding to the thickness H remains in each of the concave patterns 31.

Then, as illustrated in FIGS. 11A to 11D, an insulating film 53 is formed above the template substrate 11. The insulating film 53 preferably has the same composition as the template substrate 11, and is made of a silicon oxide film formed by a plasma CVD (Chemical Vapor Deposition) method, for example. Further, the insulating film 53 is preferably formed by film formation at a low temperature. Under such, conditions, the insulating film 53 is embedded in the concave pasterns 31.

Thereafter, as illustrated in FIGS. 12A to 12D, the insulating film 53 is etched back by using anisotropic etching, such as an RIE method, until the surface of the hard mask film 51 is exposed in the device formation pattern arrangement region $R_D$. At this time, the portion of the insulating film 53 deposited at the bottom of each concave pattern 32 is removed, and the template substrate 11 is thereby exposed.

Then, as illustrated in FIGS. 13A to 13D, the portions of the organic film 52 formed at the bottom of the concave patterns 31 are removed by using a resist peeling technique. At the bottom of each concave pattern 32 (additional pattern 212), the insulating film 53 has been removed and. the substrate 11 is exposed. Thus, at the boundary interface between each set of concave patterns 31 and the corresponding concave pattern 32, the portions of the organic film 52 inside the concave patterns 31 are in an exposed state. Accordingly, oxygen is supplied from this part to the bottom of the concave patterns 31, and the portions of the organic film 52 at the bottom of the concave patterns 31 are thereby ashed and removed. As a result, the refraction layer 54 is formed at the bottom of each of the concave patterns 31.

Thereafter, as illustrated in FIGS. 14A to 14D, an insulating film 55 is formed above the template substrate 11. The insulating film 55 preferably has the same composition as the template substrate 11, and is made of a silicon oxide film formed by a plasma CVD method, for example. Further, the insulating film 55 is preferably formed by film formation at a low temperature. The insulating film 55 serves to close the boundary between each sot of concave patterns 31 and the corresponding concave pattern 32, to prevent the bottom of the concave patterns 31 from connecting with the concave pattern 32.

Then, as illustrated in FIGS. 15A to 15D, a resist 57 is applied onto the insulating film 55, and patterning is performed to the resist 57 by using an EB drawing technique and a development technique, such that a portion of the resist 57 remains on the arrangement region for each concave pattern 32 (additional pattern 212).

Thereafter, as illustrated in FIGS. 16A to 16D, the insulating film 55 is etched back by using anisotropic etching, such as an RIE method, until the surface of the hard mast film 51 is exposed in the device formation pattern arrangement region $R_D$, which is not masked by the resist 57. Also in the arrangement region for each set of concave patterns 31, the surface of the hard mask film 51 is exposed at the positions where the concave patterns 31 are not formed. Further, at some position in each concave pattern 32, the insulating film 53 and the insulating film 55 are stacked. Hereinafter, the combination of these insulating film 53 and insulating film 55 will be referred to as "insulating layer 56".

Then, as illustrated in FIGS. 17A to 17D, the resist 57 is peeled by using a resist peeling technique. Consequently, the insulating layer 56 remains only in the arrangement region for each concave pattern 32, and results in a structure in which the boundary interface between the bottom of each set of concave patterns 31 and the corresponding concave pattern 32 is lidded with the insulating layer 56.

Thereafter, as illustrated in FIGS. 18A to 18D, a resist 58 is applied onto the template substrate 11, and patterning is preformed to the resist 58 in the device formation pattern arrangement region $R_D$ by using an EB drawing technique and a development technique. In the device formation pattern arrangement region $R_D$, patterns for forming a device formation pattern are arranged, Then, as illustrated in FIGS. 19A to 19D, the hard mask film 51 in the device formation pattern arrangement region $R_D$ is processed through the patterned resist 58 serving as a mask, by using anisotropic etching, such as an RIE method.

Further, as illustrated in FIGS. 20A to 20D, the template substrate 11 is processed through the patterned resist 58 and hard mask film 51 serving as a mask, by using anisotropic etching, such as an RIE method. Consequently, concave patterns 33 to compose a device formation pattern 22 are formed in the device formation pattern arrangement region $R_D$. The depth of the concave patterns 33 is smaller than the depth of the concave patterns 31 and 32. Thereafter, the resist 58 is peeled by using a resist peeling technique.

Then, the hard mask film 51 exposed on the template substrate 11 is removed by using anisotropic etching, such as an RIE method. Consequently, the template 10 illustrated in FIG. 3 is obtained.

According to the first embodiment, a structure is used in which each of the concave patterns 31 of the alignment marks 21 is provided with a hollow formed inside by not forming the Cr film, and the hollow is lidded with the insulating layer 56 on the upper side. Consequently, the refraction layer 54 different in refractive index from the template substrate 11 is formed at the bottom of each concave pattern 31. As the Cr film is not used for the alignment marks 21, it is achieved to provide an effect capable of suppressing static electrification during the imprint process, and obtaining desired alignment signal intensity during positioning performed even after cleaning of the template.

Further, the thickness H of the refraction layer 54 and the thickness D of the insulating layer 56 are set to satisfy any one of the following (1) to (5).

$$10 \text{ nm} \leq D < 20 \text{ nm with } 160 \text{ nm} \leq H \leq 620 \text{ nm} \quad (1)$$

$$20 \text{ nm} \leq D < 30 \text{ nm with } 150 \text{ nm} \leq H \leq 620 \text{ nm} \quad (2)$$

$$30 \text{ nm} \leq D < 40 \text{ nm with } 140 \text{ nm} \leq H \leq 630 \text{ nm} \quad (3)$$

$$40 \text{ nm} \leq D < 50 \text{ nm with } 120 \text{ nm} \leq H \leq 620 \text{ nm} \quad (4)$$

$$50 \text{ nm} \leq D \leq 200 \text{ nm with } 100 \text{ nm} \leq H \leq 600 \text{ nm} \quad (5)$$

Consequently, it is achieved to provide an effect capable of obtaining primary diffracted light intensity equivalent to that obtained in a case where the Cr film is used for the alignment marks 21. Further, as the concave patterns 31 of the alignment marks 21 are formed separately from the concave patterns 33 of the device formation pattern 22, it is possible to set the depth of the concave patterns 31 to an arbitrary depth to obtain desired primary diffracted light intensity.

(Second Embodiment)

In the first embodiment, the diffraction grating pattern, of each alignment mark is structured such that the refraction layer is arranged on the lower side and the insulating layer is arranged on the upper side. In the second embodiment; an explanation will be given of a case where the refraction layer is made of an organic film.

Figure 21A:
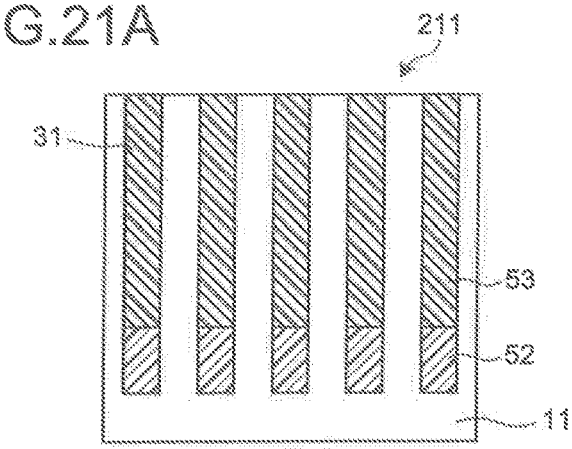
FIGS. 21A to 21C are sectional views illustrating an example of an alignment mark according to a second embodiment.
Figure 21B:
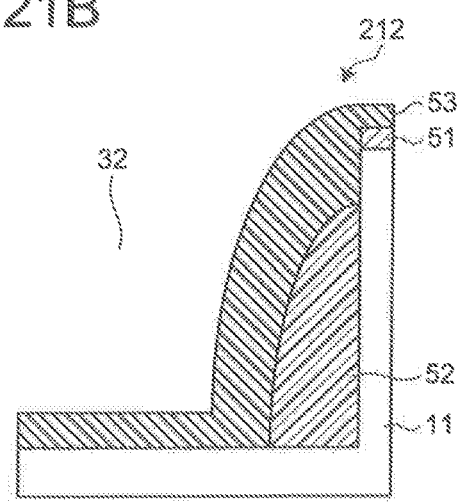
Figure 21C:
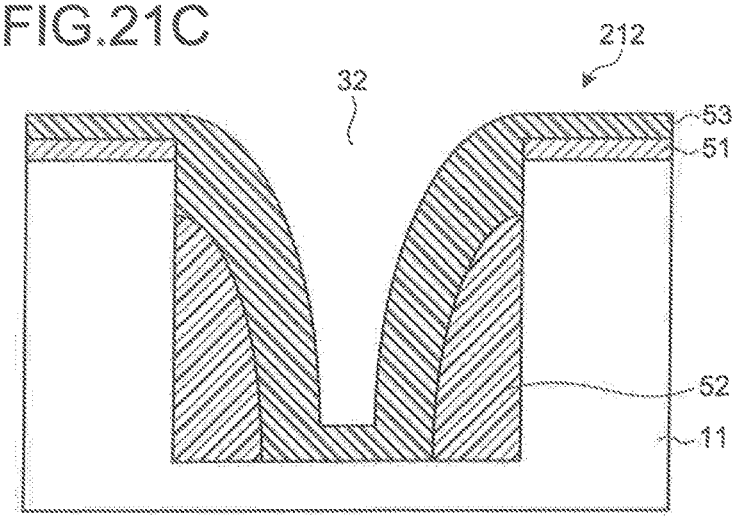

FIGS. 21A to 21C are sectional views illustrating an example of an alignment mark according to the second, embodiment. FIG. 21A corresponds to a sectional view taken along the line C-C of FIG. 3. FIG. 21B corresponds to a sectional view taken along the line D-D of FIG. 3. FIG. 21C corresponds to a sectional view taken along the line E-E of FIG. 3. As illustrated in FIG. 21A, each of the concave patterns 31 composing the diffraction grating pattern 211 is structured such that an organic film 52 having a refractive index different from the refractive index of the template substrate 11 is embedded, on the lower side and an insulating film 53 is embedded on the upper side of the organic film 52. For example, the organic film 52 is made of an SOC film or the like. Further, the upper surface of the insulating film 53 is flush with the upper surface of the template substrate 11.

Further, each additional pattern 212 has a configuration similar to that of the first embodiment, but is structured such that the portions of the organic film 52 formed on the sidewalls of each concave pattern 32, and the bottom of the concave pattern 32, are covered with the insulating film 53 in place of the insulating layer 56. Here, the constituent elements corresponding to those described in the first, embodiment are denoted by the same reference symbols, and their description will be omitted.

Figure 22A:
FIGS. 22A to 22D are sectional views schematically illustrating an example of the sequence of a template manufacturing method according to the second embodiment.
Figure 22B:
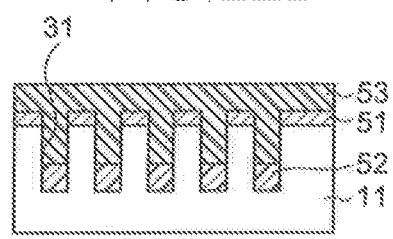
Figure 22C:
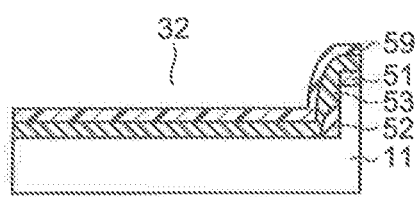
Figure 22D:
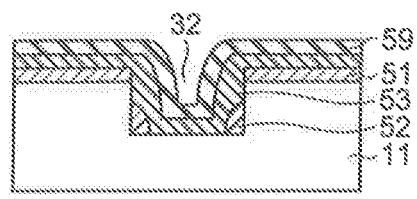

Next, an explanation will be given of a manufacturing method of the template 10 according to the second embodiment. FIGS. 22A to 22D are sectional views schematically illustrating an example of the sequence of a template manufacturing method according to the second embodiment. FIG. 22A is a sectional view of the device formation pattern arrangement region. FIG. 22B corresponds to a sectional view taken along the line C-C of FIG. 3. FIG. 22C corresponds to a sectional view taken along the line D-D of FIG. 3. FIG. 21D corresponds to a sectional view taken along the line E-E of FIG. 3. Hereinafter, in this embodiment, an explanation will be given only of differences from the first embodiment.

After FIGS. 11A to 11D in the first embodiment, as illustrated in FIGS. 22A to 22D, a resist 59 is applied onto the insulating film 53, and patterning is performed to the resist 59 by using an EB drawing technique and a development technique, such that a portion of the resist 59 remains on the arrangement region for each concave pattern 32 (additional pattern 212). This insulating film 53 serves to close the boundary portion, between each set of concave patterns 31 and the corresponding concave pattern 32. The template 10 to be used for the imprint process will be subjected to ashing of resist, which adheres between patterns, by a resist peeling technique, and further to cleaning with NC2 (New Clean 2). During this cleaning, the insulating film 53 prevents the organic film 52 at the bottom of each concave pattern 31 from being removed. Here, NC2 is a mixed liquid of trimethyl-2 hydroxyethyl ammonium hydroxide with hydrogen peroxide solution, and is alkaline.

Thereafter, the processes proceed as in the processes of FIGS. 16A to 16D and thereafter of the first embodiment. However, the insulating film 55 or insulating layer 56 in the first embodiment is replaced with the insulating film 53 in the second embodiment.

The second embodiment can provide effects similar to those of the first embodiment.

(Third Embodiment)

In the first and second embodiments, an explanation has been given of a case where the depth of the concave patterns of each alignment mark is different from the depth of the device pattern. In the third embodiment, an explanation will be given of a case where the depth of the concave patterns of each alignment mark can be equal to the depth of the device pattern.

Figure 23A:
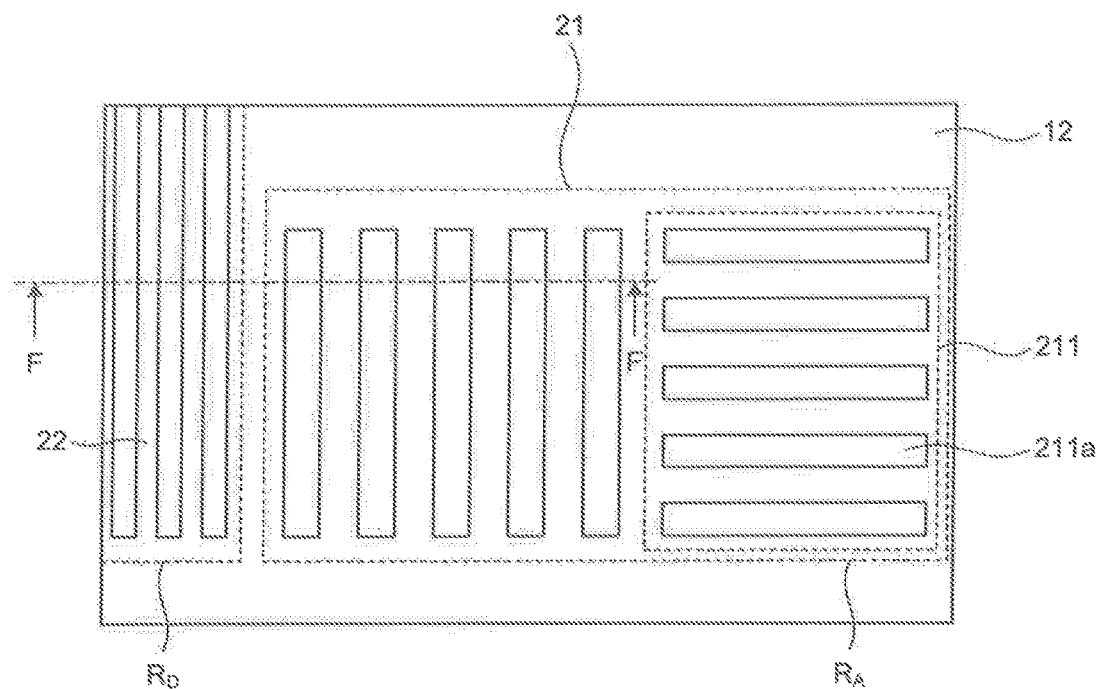
FIGS. 23A and 23B are diagrams illustrating a configuration example of a template according to a third embodiment.
Figure 23B:
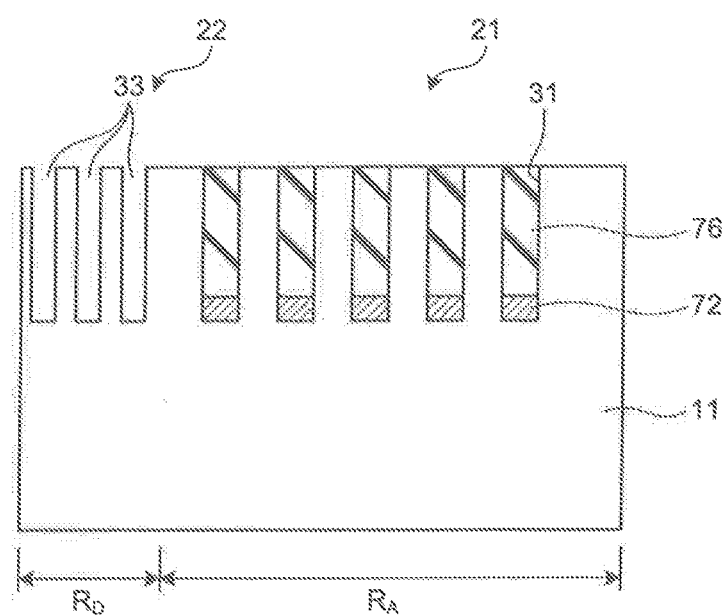

FIGS. 23A and 23B are diagrams illustrating a configuration, example of a template according so the third embodiment. FIG. 23A is a partial top view illustrating an example of a region including alignment marks of the template. FIG. 23B is a partial sectional view illustrating the example of the region including alignment marks of the template, which is a sectional view taken along a line F-F of FIG. 23A. In the third embodiment, each of the alignment marks 21 includes a diffraction grating pattern 211 to be used for performing positioning with respect to the substrate. For example, the diffraction grating pat tern 211 is composed of line and space patterns, in which a plurality of extending patterns 211a are arranged at predetermined intervals in a direction intersecting with the extending direction, Further, in the example of FIG. 23A, two alignment marks 21 are arranged in each of the alignment mark arrangement regions $R_A$, such that the extending directions of their diffraction grating patterns 211 are orthogonal with each other.

The diffraction grating pattern 211 is composed of concave patterns 31 formed and extending in the template substrate 11, and includes a refraction layer 72 provided at the bottom of each concave pattern 31, and an insulating layer 76 provided on the refraction layer 72. In other words, the diffraction grating pattern 211 has a structure such that the refraction layer 72 is confined at the bottom of each concave pattern 31 by the insulating layer 76 so as not to come into contact with the outside. The insulating layer 76 is made of silicon oxide or the like, and is preferably made of the same material as the template substrate 11. It is sufficient if the refraction layer 72 is made of a material different in refractive index from the template substrate 11. The refraction layer 72 may be exemplified by a film of metal, such as Cr, Ta, Ti, or Ru; a film of metal nitride, such as TiN or TaN; a film of metal oxide, such as TaO; an SiN film; or a combination of these materials.

In the third embodiment, the depth of the concave patterns 31 of the diffraction grating pattern 211 is equal to the depth of the concave patterns 33 of the device formation pattern 22. Farther, in the third embodiment, each alignment mark 21 is not provided with the additional pattern 212. Here, the constituent elements corresponding to those described in the first embodiment are denoted by the same reference symbols, and their description will be omitted.

Next, an explanation will be given of a manufacturing method of the template 10 according to the third embodiment. FIGS. 21A to 24G are sectional views schematically illustrating an example of the sequence of a template manufacturing method according to the third embodiment. FIGS. 24A to 24G correspond to a sectional view taken along the line F-F of FIG. 23A.

Figure 24A:
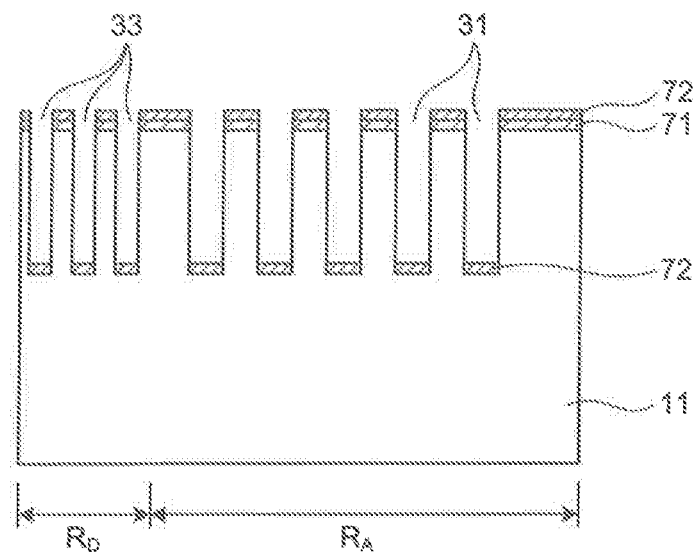
FIGS. 24A to 24G are sectional views schematically illustrating an example of the sequence of a template manufacturing method according to the third embodiment.

First, as illustrated in FIG. 24A, a template substrate 11 is prepared, and a hard mask film 71 is formed on the upper surface of the template substrate 11. As the template substrate 11, for example, a synthetic quartz substrate or the like may be used. Further, as the hard mask film 71, for example, a film of metal, such as Cr, Ta, Ti, or Ru; a film of metal nitride, such as TiN or TaN; a film of metal oxide, such as TaO; or an SiN film may be used.

Then, a resist (not shown) is applied onto the hard mask film 71, and patterning is performed to the resist by using an EB drawing technique and a development technique. Here, patterns are formed in the device formation pattern arrangement region $R_D$ and the alignment mark arrangement regions $R_A$. In the device formation pattern arrangement region $R_D$, patterns for forming the device formation pattern 22 are formed. In each alignment mark arrangement region $R_A$, patterns for forming the diffraction grating patterns 211 are formed.

Thereafter, the hard mask film 71 is processed through the patterned resist serving as a mask, by using anisotropic etching, such as an RIE method. Further, the template substrate 11 is processed through the patterned resist and hard mask film 71 serving as a mask, by using anisotropic etching, such as an RIE method. Consequently, concave patterns 31 to compose the diffraction grating patterns 211 in each alignment mart arrangement region $R_A$, and concave patterns 33 in the device formation pattern arrangement region $R_D$ are simultaneously formed. Thereafter, the resist, is peeled by using a resist peeling technique.

Further, a refraction layer 72 is formed on the upper surface of she template substrate 11. This refraction layer 72 is also formed at the bottom, of the concave patterns 31 and 33. The refraction layer 72 may be exemplified by a film of metal, such as Cr, Ta, Ti, or Ru; a film of metal nitride, such as TiN or TaN; a film of metal oxide, such as TaO; an SiN film; or a combination of these materials.

Figure 24B:
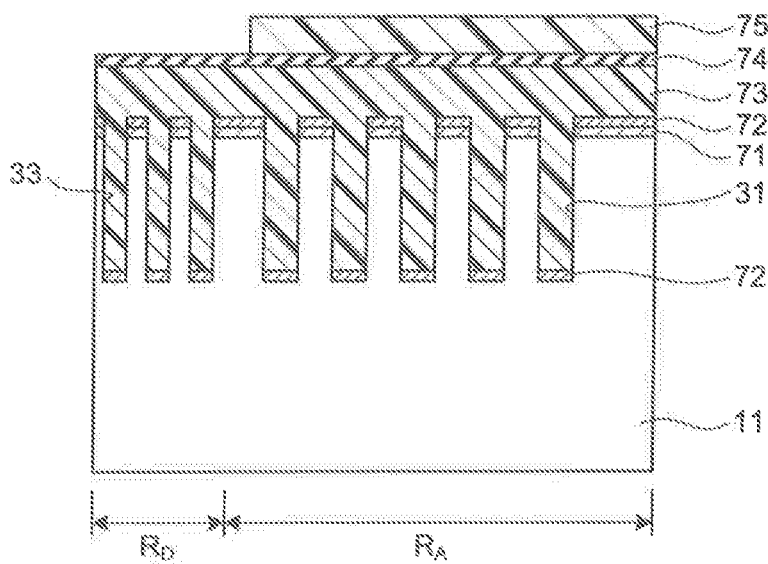

Then, as illustrated in FIG. 24B, a planarization film 73 and a planarization film 74 are formed in this order on the template substrate 11 with the concave patterns 31 and 33 formed thereon. As the planarization film 73, for example, an SOC film may be used. As the planarization film 74, an SOG (Spin On Glass) film having an antireflection function may be used. Further, a resist 75 is applied onto the planarization film 74, and patterning is performed to the resist 75 by using an EB drawing technique and a development technique, such that a portion of the resist 75 remains on each alignment mark arrangement region $R_A$.

Figure 24C:
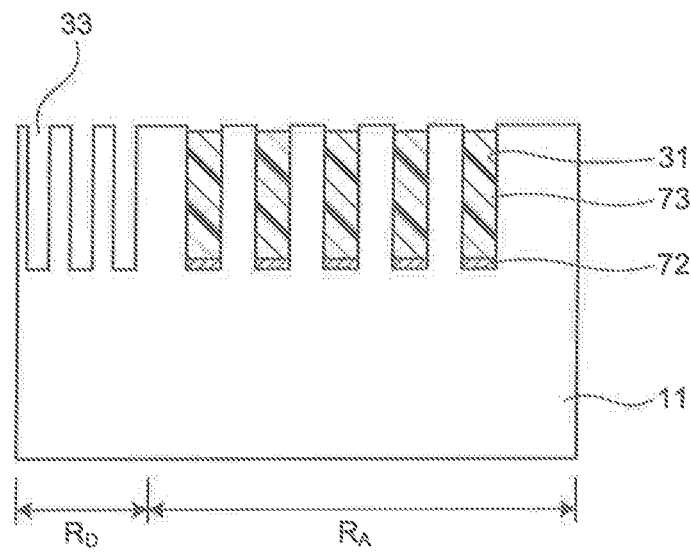

Thereafter, as illustrated in FIG. 24C, the planarization film 74 is processed through the patterned resist 75 serving as a mask, by using anisotropic etching. such, as an RIE method. Then, the planarization film 73, the refraction layer 72, and the hard mask film 71 are partly removed through the planarization film 74 serving as a mask, by using anisotropic etching, such as an RIE method. Further, the planarization film 74, the planarization film 73, the refraction layer 72, and the hard mask film 71 are removed by using anisotropic etching, such as an RIE method, such that a portion of the planarization film 73 remains inside each of the concave patterns 31 in each alignment mark arrangement region $R_A$. Consequently, inside each of the concave patterns 33 in the device formation pattern arrangement region $R_D$, the portion of the refraction layer 72 at the bottom is removed. On the other hand, inside each of the concave patterns 31 in each alignment mark arrangement region $R_A$, the portion of the refraction layer 72 at the bottom and the portion of the planarization film 73 on its upper side remain.

Figure 24D:
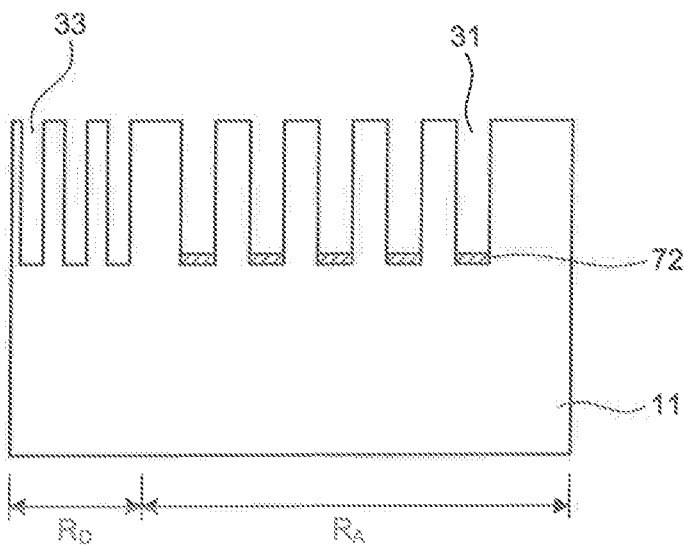

Then, as illustrated in FIG. 24D, the portions of the planarization film 73 inside the concave patterns 31 in the alignment mark arrangement regions $R_A$ are removed by using a resist peeling technique.

Figure 24E:
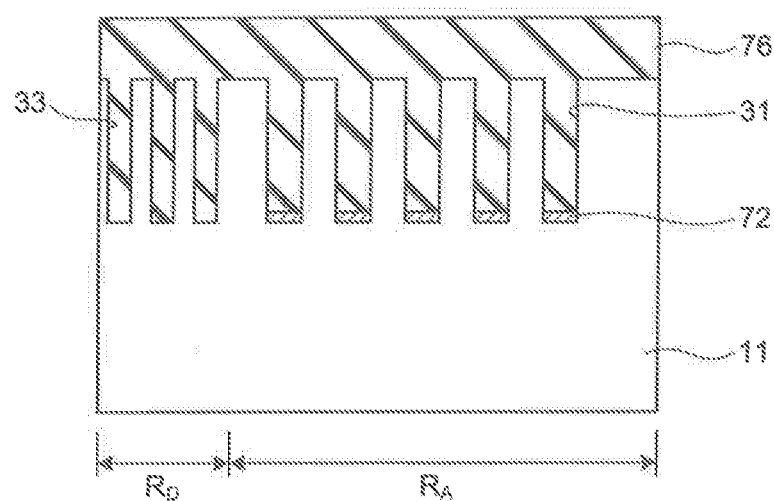

Thereafter, as illustrated in FIG. 24E, an insulating layer 76 is formed on the template substrate 11 with the concave patterns 31 and 33 formed thereon. The insulating layer 76 is formed to fill the concave patterns 31 and 33, and to nave an upper surface higher than the upper surface of the template substrate 11. The insulating layer 76 preferably has the same composition as the template substrate 11, and is made of a silicon oxide film formed by a plasma CVD method, for example.

Figure 24F:
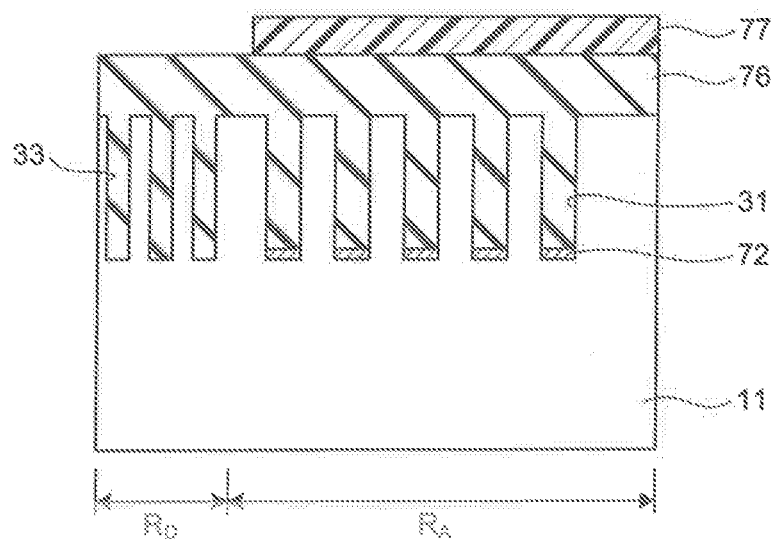

Then, as illustrated in FIG. 24F, a resist 77 is applied onto the insulating layer 76, and patterning is performed to the resist 77 by using an EE drawing technique and a development technique, such that a portion of the resist 77 remains on each alignment mark arrangement region $R_A$.

Figure 24G:
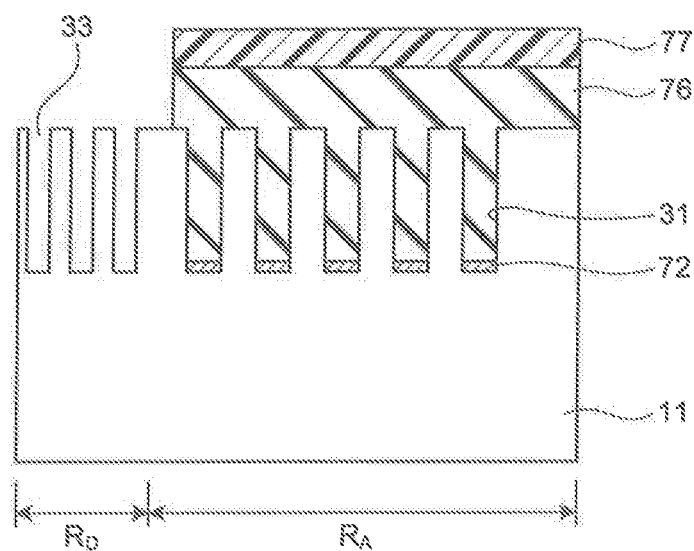

Thereafter, as illustrated in FIG. 24G, in the device formation pattern arrangement region $R_D$, which is not masked by the resist 75, the portions of the insulating layer 76 on the upper surface of the template substrate 11 and inside the concave patterns 33 are removed by using anisotropic etching, such as an RIE method. Thereafter, the resist 77 is peeled by using a resist peeling technique.

Then, the portion of the insulating layer 76 on each alignment mark arrangement region $R_A$ is removed by using anisotropic etching, such as an RIE method. Consequently, the template 10 illustrated in FIGS. 23A and 23B is obtained.

According to the third embodiment, inside each of the concave patterns 31 in each alignment mark arrangement region $R_A$, the refraction layer 72 is arranged at the bottom and the insulating layer 76 is embedded on its upper side. Thus, as the refraction layer 72 is protected by the insulating layer 76, static electrification of the template 10 during the imprint process is suppressed. Consequently, it is possible to prevent electric discharge from being caused when the template 10 is released. Further, it is possible to prevent the refraction layer 72 from being made thinner by a wet process using an alkaline solution, which is included in cleaning to the template. As a result, it is also achieved to provide an effect capable of preventing the alignment signal intensity from, being lowered in positioning for the imprint process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein, may be made without departing from the spirit of the inventions. The accompanying claims and their equivalents are intended to cover such forms or modifications as would fall within the scope and spirit of the inventions.

What is claimed is:

1. A template comprising:
a template substrate; and
a device formation pattern and an alignment mark provided on a common surface of the template substrate,
wherein the alignment mark includes
a refraction layer provided at a bottom of a first concave pattern provided on the template substrate, and
an insulating layer filling the first concave pattern provided with the refraction layer, and
the refraction layer is made of an organic film, or at least one material selected from the group consisting of Cr, Ta, Ti, Ru, TiN, TaO, TaN and SiN.

2. The template according to claim 1, wherein, in the alignment mark, a plurality of first concave patterns that extend are arrayed in a direction intersecting with an extending direction.

3. The template according to claim 1, wherein
the alignment mark further includes a second concave pattern that connects to each other one-end portions of the plurality of first concave patterns, and
a boundary interface between the first concave patterns and the second concave pattern is covered with the insulating layer.

4. The template according to claim 3, wherein the first concave patterns have a depth that is equal to a depth of a third concave pattern composing the device formation pattern or larger than the depth of the third concave pattern.

5. The template according to claim 3, wherein, where H denotes a thickness of the refraction layer and D denotes a thickness of the insulating layer inside the first concave pattern, the D and the H have a relationship therebetween that satisfies
10 nm≤D<20 nm with 160 nm≤H≤620 nm,
20 nm≤D<30 nm with 150 nm≤H≤620 nm,
30 nm≤D<40 nm with 140 nm≤H≤620 nm,
40 nm≤D<50 nm with 120 nm≤H≤620 nm, or
50 nm≤D≤200 nm with 100 nm≤H≤600 nm.

6. The template according to claim 1, wherein the refraction layer has a refractive index different from a refractive index of the template substrate.

7. A template comprising:
a template substrate; and
a device formation pattern and an alignment mark provided on a common surface of the template substrate,
wherein the alignment mark includes
a refraction layer provided at a bottom of a first concave pattern provided on the template substrate, and
an insulating layer filling the first concave pattern provided with the refraction layer, and
where H denotes a thickness of the refraction layer and D denotes a thickness of the insulating layer inside the first concave pattern, the D and the H have a relationship therebetween that satisfies
10 nm≤D<20 nm with 160 nm≤H≤620 nm,
20 nm≤D<30 nm with 150 nm≤H≤620 nm, 30 nm≤D<40 nm with 140 nm≤H≤620 nm,
40 nm≤D<50 nm with 120 nm≤H≤620 nm, or
50 nm≤D≤200 nm with 100 nm≤H≤600 nm.

* * * * *